(12) United States Patent
Meli

(10) Patent No.: US 6,728,900 B1
(45) Date of Patent: Apr. 27, 2004

(54) MICROCOMPUTER WITH TEST INSTRUCTION MEMORY

(75) Inventor: Louis Marcel Meli, Kuesnacht (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 546 days.

(21) Appl. No.: 09/656,833

(22) Filed: Sep. 7, 2000

(30) Foreign Application Priority Data

Sep. 10, 1999 (EP) .............................. 99202948

(51) Int. Cl.[7] ............... G06F 11/00; G06F 9/44; G01R 19/00
(52) U.S. Cl. ............... 714/25; 714/17; 714/30; 714/47; 717/127; 702/64
(58) Field of Search ............... 714/17, 25, 47, 714/30; 712/227; 717/127–130; 702/58, 64

(56) References Cited

U.S. PATENT DOCUMENTS

| | | | |
|---|---|---|---|
| 4,870,345 A | * 9/1989 | Tomioka et al. ............... 714/731 |
| 4,870,573 A | 9/1989 | Kawata et al. ............... 364/200 |
| 5,530,804 A | * 6/1996 | Edgington et al. ............ 714/30 |
| 5,706,294 A | * 1/1998 | Takahashi et al. ........... 714/724 |
| 5,802,071 A | 9/1998 | Fang et al. ................. 371/22.1 |
| 6,106,572 A | * 8/2000 | Halpern ....................... 717/130 |
| 6,539,498 B1 | * 3/2003 | Sato ............................. 714/38 |

* cited by examiner

Primary Examiner—Robert Beausoliel
Assistant Examiner—Emerson Puente
(74) Attorney, Agent, or Firm—Aaron Waxcer

(57) ABSTRACT

The microcomputer has an instruction memory interface that applies instructions to an instruction execution unit. In a normal state instructions are obtained from instruction memory under control of a normal program counter. In a test state a same source of an instruction is used cyclically to apply a same instruction information from a test instruction memory. Normal addressing is suppressed in the test state, so that the same instruction is executed repeatedly independent of normal program flow.

15 Claims, 2 Drawing Sheets

MICROCOMPUTER WITH TEST INSTRUCTION MEMORY

BACKGROUND OF THE INVENTION

The invention relates to a microcomputer and to a method of testing such a microcomputer.

From U.S. Pat. No. 5,802,071 it is known to test a microcomputer by executing a test program from a test program memory. As described in this document, the test program memory makes it possible to test the microcomputer independent of the content of the application program. This document also describes how to test items in the microcomputer by observing the results produced by executing instructions from the program.

The document does not discuss testing timing of instruction execution. In particular it does not describe testing whether the microcomputer can execute instructions fast enough. However, in a conventional synchronous microcomputer slow execution of an instruction will show itself automatically in the form of erroneous results produced by execution of that instruction.

This will not work in asynchronous microcomputers. Asynchronous microcomputers are microcomputers that receive successive instructions by means of handshaking, completion of one instruction triggering delivery of the next instruction. If an asynchronous computer executes instructions too slowly, the instructions will produce the right results, but execution will take too much time. In contrast, a synchronous computer uses a periodic clock to trigger execution of successive instructions. Consequently, if the synchronous computer executes instructions too slowly, instructions will be executed in time, but the results will be wrong, which can be easily detected.

The instruction execution speed of an instruction by an asynchronous computer can be measured by measuring the time needed to execute that instruction a number of times. However, the result of this measurement may not be an accurate measure of the time needed to execute that instruction. The measured execution time may also involve delays due to instruction fetch delays and the time needed for program control flow instructions. If the instruction is executed by executing copies of the instruction in successive locations in instruction memory, instruction testing moreover will take considerable time or memory space, because all the copies need to be loaded or stored in memory.

U.S. Pat. No. 5,802,071 also does not discuss measurement of current consumed by the computer during instruction execution. For low power applications it may be necessary to guarantee that current consumption of a manufactured computer, in particular a computer on a chip like a microcontroller, will be below a specified level. To guarantee this, the current consumed during execution of particular instructions must be measured. For an accurate measurement, the measurement should be free from variable current consumption factors due to fetching or execution of flow control instructions.

SUMMARY OF THE INVENTION

It is an object of the invention to provide for measurement of the speed of execution of an instruction by a microcomputer without inaccuracy due to time needed for program flow control.

It is a further object of the invention to provide for measurement of the speed of execution of an instruction by a microcomputer without requiring much time or memory space for the loading the instruction.

It is another object of the invention to provide for measurement of the current consumption during execution of an instruction by a microcomputer without inaccuracy due to current consumption needed for program flow control.

The microcomputer according to the invention is described in claim 1. According to the invention the microcomputer is capable of operating in a test mode in which normal instruction sequencing is suppressed in order to enforce cyclical application of the same instruction from the same source to an instruction execution unit. In this way, significant timing variations due to other effects than execution of the instruction are eliminated. In an asynchronous microcomputer it is advantageous to arrange the computer according to the invention. In this way, the time needed to execute the instruction can be accurately measured during testing. Of course, the invention can also be applied to a synchronous microcomputer, for example to detect any spread in execution speed that may not show up as errors in the result of the instructions.

In an embodiment, the computer comprises a special test instruction memory, outside an address space used during normal program execution. During test, the instruction is read repeatedly from the test instruction memory. By placing a specific instruction in the test instruction memory and switching the microcomputer into the test mode, it can be measured accurately whether the parts of the microcomputer involved in the execution of that instruction are sufficiently fast, because delays caused by addressing or reading the normal memory are eliminated. Preferably, the test instruction memory contains only one instruction, the microcomputer re-feeding that instruction to the instruction execution unit each time when its previous execution has been completed. Thus, a minimal amount of memory is needed for executing the instruction and execution is highly reproducible. In case the instruction consists of multiple words that are loaded sequentially, the microcomputer preferably loads the words sequentially and returns to the first word once the execution of the instruction has been completed. In this case, the test instruction memory needs to contain only as many words as the longest possible single instruction of the microcomputer.

Preferably, the microcomputer is incorporated in an integrated circuit with a scan-test interface, for serially inputting and outputting test information via a shift register. In this case, an instruction is preferably loaded via the shift register, together with a command that causes the microcomputer to execute the loaded instruction repeatedly in test mode in order to test the time needed for executing the instruction.

A method of testing that uses such a microcomputer comprises loading an instruction into a test memory location and executing that instruction repeatedly. Preferably, the method comprises loading several instructions in turn and repeatedly executing each instruction before loading the next instruction. With different instructions the speed of different parts of the microcomputer can be tested.

BRIEF DESCRIPTION OF THE DRAWING

These and other advantageous aspects of the computer and method of testing the computer according to the invention will be described in more detail using the following figures.

DESCRIPTION OF THE PREFERRED EMBODIMENTS

Figure 1:
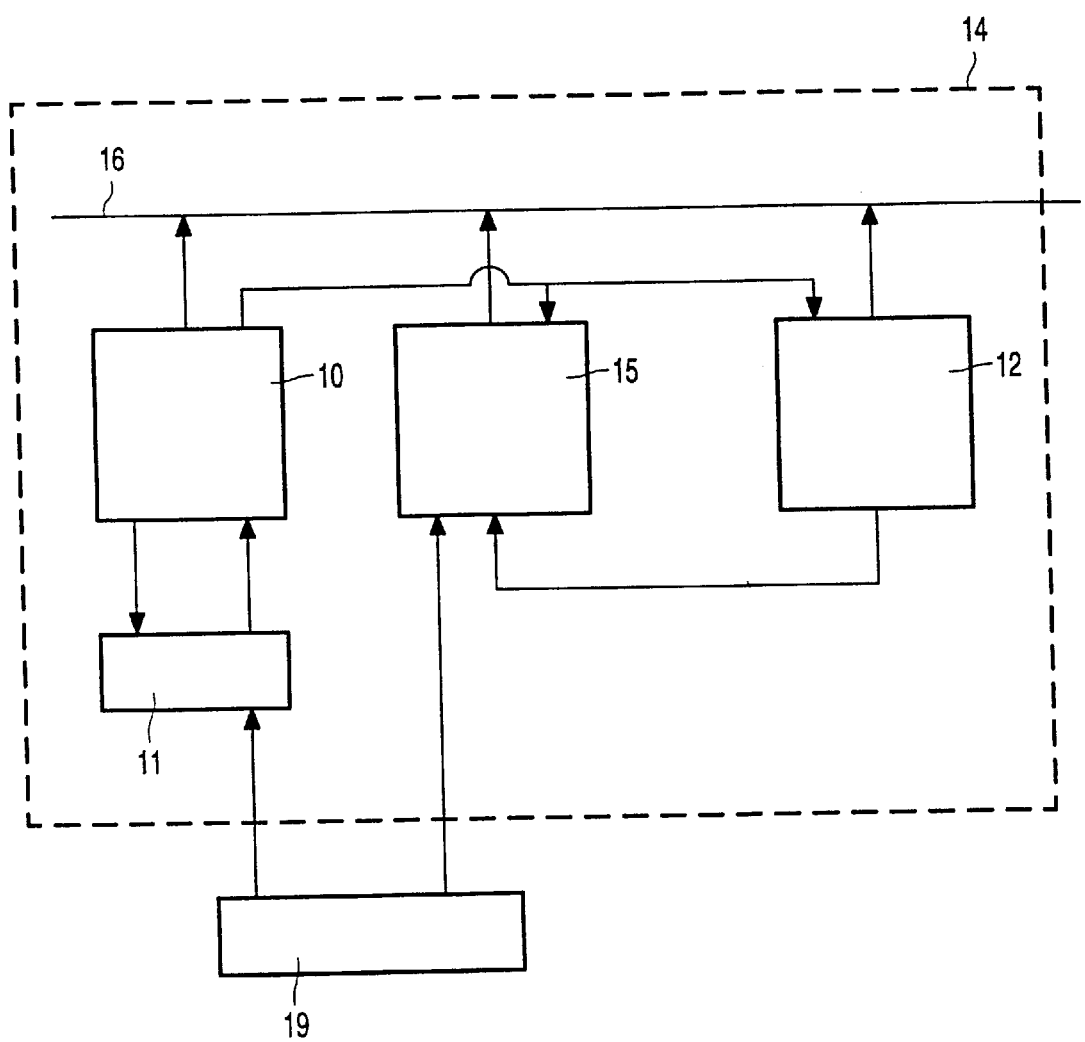
FIG. 1 shows a computer

FIG. 1 shows a block diagram of a computer 14. Parts of the computer 14 that are not used for describing operation of the invention are not shown. FIG. 1 shows an instruction execution unit 10, a request logic circuit 11, an instruction memory 12, a forced instruction block module 15 and a communication bus 16. Instruction execution unit 10 has an instruction memory enable output coupled to instruction memory 12 and forced instruction block 15. Instruction memory 12 has an instruction address input coupled to instruction execution unit 10 via bus 16. Instruction memory 12 has an instruction output coupled to forced instruction block module 15. Forced instruction block module 15 has an instruction output coupled to instruction execution unit 10 via bus 16. Request logic circuit 11 and forced instruction block module 15 have control inputs coupled to a test control unit 19 external to computer 14.

Figure 2:
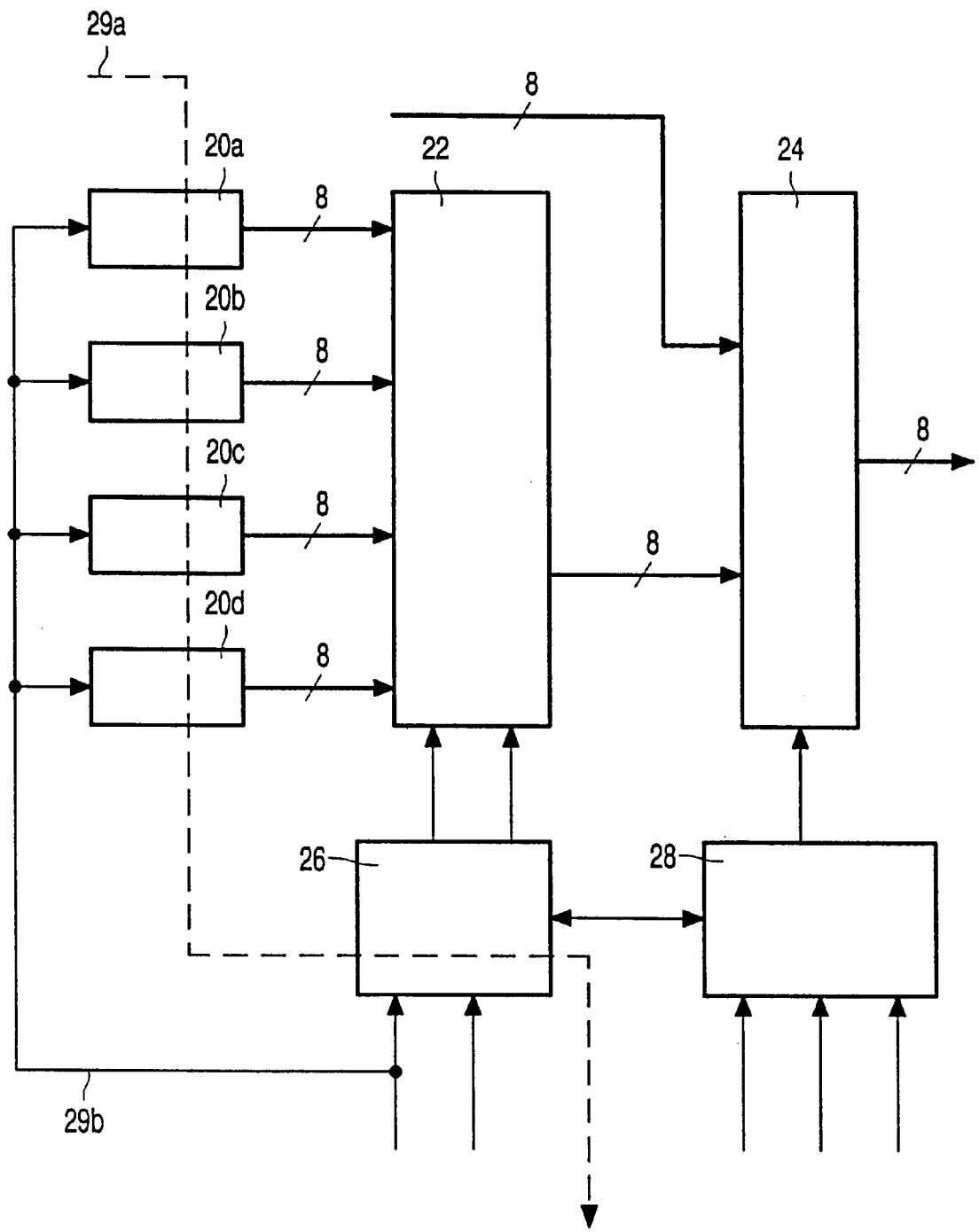
FIG. 2 shows a forced instruction block module.

FIG. 2 shows a forced instruction block module. This module contains registers 20*a–d*, a first and second multiplexer 22, 24 a counter 26 and a control unit 28. The registers 20*a–b* have outputs coupled to the first multiplexer 22. The second multiplexer 24 has inputs coupled to an output of the first multiplexer 22 and the instruction output of the instruction memory 12 (not shown in FIG. 2). An output of the second multiplexer 24 is coupled to the instruction execution unit 10 via bus 16 (both not shown in FIG. 2). Counter 26 has an enable input coupled to the instruction memory enable output of the instruction execution unit 10. Counter 26 has a count output coupled to a control input of the first multiplexer 22. Registers 20*a–d* and counter 26 are part of a scan chain, shown schematically as 29*a*. (A scan chain is part of a well known test technique, which makes all internal flip-flops and registers of a circuit accessible via a shift register). Registers 20*a–d* and counter 26 have scan control inputs coupled to a scan control connection 29*b*. Control unit 28 has an input coupled to the test control unit 19 (not shown in FIG. 2). Control unit 28 has a connection with counter 26 and an output coupled to a control input of the second multiplexer 24.

In operation a control signal applied to forced execution clock module 15 and request logic circuit 11 may be used to bring the computer in a normal operation mode. In the normal operation mode instruction execution unit 10 supplies successive instruction addresses to instruction memory 12 via bus 16. In addition, instruction execution unit 10 supplies an enable signal to instruction memory 12 when an instruction address is available on bus 16. In response, instruction memory 12 delivers the instructions corresponding to the instruction addresses to the instruction execution unit 10 via the second multiplexer 24 of the forced execution block module 15 and the bus 16. Instruction execution unit 10 executes these instructions.

In case an asynchronous instruction execution unit 10 is used, the start of execution of each instruction is controlled by means of a handshake between instruction execution unit 10 and request logic circuit 11. Each time the instruction execution unit 10 is ready to execute a next instruction it supplies a request signal to request logic circuit 11. In response request logic circuit 11 supplies an acknowledge signal to instruction to instruction execution unit 10, which causes instruction execution unit 10 to start execution of a next instruction. Request logic circuit 11 may use information from the handshakes in various ways. For example, request logic circuit 11 may cause a supply voltage to the instruction execution unit 10 to be reduced or increased if request signals arrive faster or slower than necessary for a given task respectively. Reduction of the supply voltage reduces the power consumed by the instruction execution unit 10.

When the computer 14 is used for a given application, say a telephone handset, it has to be guaranteed that speed and power consumption satisfy certain predetermined specifications. Due to process fluctuations or errors during manufacture of the computer 14, these parameters may vary. The computer 14 needs to be tested to ensure that the specifications are met. For this reason, the computer 14 has to be tested, by measuring for example the time it takes the instruction execution unit 10 to execute an instruction under test when a given supply voltage is applied to the instruction execution unit 10. Another test involves measuring the current consumed by the computer 14 when it executes this instruction under test.

For this purpose, the instruction execution unit 10 is forced to execute the instruction under test repeatedly during a time interval and it is measured how many times this instruction is executed during that time interval. The number of times that the instruction under test is executed is not fixed by a clock rate, but depends on the speed with which the instruction execution unit 10 returns request signals upon acknowledge signals. Different instructions may be used as instruction under test in successive tests to test different parts of the instruction execution unit 10. Similarly, the current used by the computer 14 may be measured during repeated execution of the instruction under test.

The forced instruction block module 15 provides for the repeated execution of an instruction under test. The test control unit 19 applies a control signal to the forced instruction block module 15 to bring it into a test mode. In the test mode, the forced instruction block module 15 cyclically supplies the content of registers 20*a–d* to the instruction execution unit 10 via bus 16 instead of the instruction produced by instruction memory.

The forced instruction block module 15 shown in FIG. 2 is designed for a type of instruction execution unit 10 that uses instructions that may consist of 1, 2, 3 or 4 bytes that are transmitted successively via bus 16. In a first step of the test, the bytes that make up the instruction under test, a counter control signal and a control signal to enable the forced instruction execution block 15 are loaded via the scan chain 29*a*. In a subsequent step the forced instruction execution block module 15 is made to operate in the test mode. In the test mode, the counter 26 causes the first multiplexer 22 to pass the content of a cyclical succession of the registers 20*a–b* to the second multiplexer 24. The second multiplexer 24 passes this content to the bus 16 instead of the instruction from instruction memory 12. During this step it is counted how many times the instruction is executed during a given time interval. As the instruction under test is executed repeatedly the time interval can start and stop at any desired time.

In an embodiment, the counter has two modes, selected via the scan chain 29*a* dependent on the number of bytes contained in the instruction under test. In the first mode, the counter 26 has a cycle of four, selecting a first, second, third and fourth one of the registers 20*a–d* successively and subsequently repeating this selection of these registers 20*a–d* cyclically. The first mode is used when the instruction under test is one, two or four bytes long. In case of a one byte long instruction under test, four copies of the instruction are loaded into the four registers 20*a–d* via the scan chain 29*a*. In case of a two byte long instruction under test copies the first byte of the instruction are loaded into the first and third register 20*a,c* and copies of the second byte of the instruction are loaded into the second and fourth register 20*b,d*. In case of a four byte instruction under test the bytes of the instruction are loaded into the different registers 20*a–d*.

In the second mode, the counter 26 has a cycle of three, selecting a first, second and third one of the registers 20*a–c* successively and subsequently repeating the selection of these three registers 20*a–c* cyclically. The second mode is used when the instruction under test is three bytes long. The bytes of the instruction are loaded into the three different registers 20*a–d* that will be loaded cyclically. Thus only one bit in the scan chain 29*a* is needed to select between one, two, three or four byte instructions.

Of course other types of instruction execution units 10 may be used. For example, instructions may always be supplied in one cycle. In that case, the counter 26, first multiplexer 22 and different registers 20*a–d* are not needed. Only one register is needed to supply the instruction under test to the second multiplexer 24. Other maximum instruction lengths than four bytes may be used. More registers 20*a–d* than needed for the maximum length instruction may be used in order to make it possible to load and execute different instructions alternately during a test. Instead of registers 20*a–d*, one could use a small memory, the counter 26 addressing this memory. In this case the first multiplexer 22 may be omitted. Of course registers 20*a–d* have the advantage over a memory that they can be incorporated directly in a scan chain. If the execution unit has fixed length instructions, the least significant bits of instruction addresses may be used instead of the output of the counter 26.

Without deviating from the invention, other variations in the embodiment ore possible. For example, the forced instruction block module 15 may be inserted between the bus 16 and the instruction execution unit 10, instead of between the instruction memory 12 and the bus. Thus, execution time can be measured without delays from the bus. One might even include two forced instruction block modules 15, one between the instruction memory 12 and the bus 16 and one between the bus 16 and the instruction execution unit 10. Thus, execution time can be measured with and without delays from the bus 16, which makes it possible to test the delays caused by the bus. For similar reasons a forced instruction block module 15 may be inserted at other positions in the processor.

Although the preferred embodiment uses a scan chain to load the registers 20*a–d*, other arrangements for loading these register can also be used. For example, the registers 20*a–d* may be memory mapped, allowing the instruction execution unit 10 to write the instruction under test into the registers 20*a–d*. Alternatively, the registers may be treated as special function registers of the instruction execution unit 10, so that they the instruction execution unit 10 can write the instruction under test into these registers by means of a write to register instruction.

What is claimed is:

1. A microcomputer comprising
    an instruction execution unit;
    a test circuit for enabling the microcomputer to operate in a normal state or in a test state alternatively;
    an instruction memory interface enabled in the normal state to apply instruction information to the instruction execution unit from instruction memory addresses sequenced under control of program flow;
    a test sequencing unit enabled in the test state to control application of instruction information to the instruction execution unit, the test sequencing unit overruling sequencing as applied in the normal state, so that a same source of an instruction is used cyclically to apply a same instruction information from the same source to the instruction execution unit repeatedly, independent any sequencing implied by the instruction information, wherein said test sequencing unit measures current consumed when it executes the instruction under test.

2. A microcomputer according to claim 1, the microcomputer comprising test instruction storage and a test instruction counter for cyclically counting selection signals selecting the instruction information from the test instruction storage, wherein a given supply voltage is applied to the instruction execution unit for determining a time of duration when said instruction execution unit executes an instruction under test.

3. A microcomputer according to claim 2, further comprising a test instruction reset circuit for resetting the test instruction counter to its initial value when the test instruction counter has reached a selectable value.

4. A microcomputer according to claim 2, the test instruction storage having a size not bigger than needed for storing a longest instruction executable by the instruction execution unit.

5. A Microcomputer according to claim 2, wherein the instruction storage comprises a plurality of registers, for storing successive units of an instruction under test, the test instruction counter counting successive units of the instruction under test, the test sequencing unit supplying the units to the instruction unit successively.

6. A microcomputer according to claim 2, wherein the instruction storage comprises a plurality of registers, for storing successive units of an instruction under test, the registers being part of a test scan chain.

7. A microcomputer comprising
    an instruction execution unit;
    a test circuit for enabling the microcomputer to operate in a normal state or in a test state alternatively;
    an instruction memory interface enabled in the normal state to apply instruction information to the instruction execution unit from instruction memory addresses sequenced under control of program flow;
    a test sequencing unit enabled in the test state to control application of instruction information to the instruction execution unit, the test sequencing unit overruling sequencing as applied in the normal state, so that a same source of an instruction is used cyclically to apply a same instruction information from the same source to the instruction execution unit repeatedly, independent of any sequencing implied by the instruction information,
    the microprocessor comprising test instruction storage and a test instruction counter for cyclically counting selection signals selecting the test instruction information from the test instruction information wherein the instruction execution unit being arranged to operate asychronously, the microcomputer adapting an instruction execution frequency to a response time of the instruction execution unit.

8. A microcomputer according to claim 7, comprising a test instruction reset circuit for resetting the test instruction counter to its initial value when the test instruction counter has reached a selectable value.

9. A microcomputer according to claim 7, the instruction storage comprising a plurality of registers, for storing successive units of an instruction under test, the test instruction counter counting successive units of the instruction under test, the test sequencing unit supplying the units to the instruction unit successively.

10. A microprocessor according to claim 7, the instruction storage comprising a plurality of registers, for storing successive units of an instruction under test, the registers being part of a test scan chain.

11. A microcomputer comprising
an instruction execution unit;
a test circuit for enabling the microcomputer to operate in a normal state or in a test state alternatively;
an instruction memory interface enabled in the normal state to apply instruction information to the instruction execution unit from instruction memory addresses sequenced under control of program flow;
a test sequencing unit enabled in the test state to control application of instruction information to the instruction execution unit, the test sequencing unit overruling sequencing as applied in the normal state, so that a same source of an instruction is used cyclical to apply a same instruction information from the same source to the instruction execution unit repeatedly, independent of many sequencing implied by the instruction information,
the microprocessor comprising test instruction storage and a test instruction counter for cyclically counting selection signals selecting the test instruction information from the test instruction storage; and
a test instruction circuit counting selectably three or four locations in test instruction storage before being reset.

12. A microcomputer according to claim 11, comprising a test instruction reset circuit for resetting the test instruction counter to its initial value when the test instruction counter has reached a selectable value.

13. A microcomputer according to claim 11, the instruction storage comprising a plurality of registers, for storing successive units of an instruction under test, the test instruction counter counting successive units of the instruction under test, the test sequencing unit supplying the units to the instruction unit successively.

14. A microcomputer according to claim 11, the instruction storage comprising a plurality of registers, for storing successive units of an instruction under test, the registers being part of a test scan chain.

15. A method of testing a microcomputer, the method comprising supplying an instruction under test repeatedly to an instruction execution unit from a test instruction storage that is selected bypassing a program counter based instruction addressing mechanism used during operation of the microcomputer outside testing;
arranging the instruction execution unit to operate asynchronously, the microcomputer adapting an instruction execution frequency to a response time of the instruction execution unit.

* * * * *